United States Patent [19]

Hilland

[11] Patent Number: 5,089,929
[45] Date of Patent: Feb. 18, 1992

[54] RETROFIT INTEGRATED CIRCUIT TERMINAL PROTECTION DEVICE

[75] Inventor: David H. Hilland, Albuquerque, N. Mex.

[73] Assignee: The United States of America as represented by the Secretary of the Air Force, Washington, D.C.

[21] Appl. No.: 491,803

[22] Filed: Mar. 8, 1990

[51] Int. Cl.⁵ .......................... H02H 3/22; H02H 9/04
[52] U.S. Cl. :...................................... 361/111; 361/56; 357/23.13
[58] Field of Search ...................... 361/111, 56, 88, 91; 357/23.13, 68, 74; 174/52.4

[56] References Cited

U.S. PATENT DOCUMENTS

| | | | |
|---|---|---|---|
| 3,614,546 | 10/1971 | Avins et al. | 317/234 |
| 3,742,420 | 6/1973 | Harnden, Jr. | 338/21 |
| 3,754,170 | 8/1973 | Tsuda et al. | 317/235 |
| 4,019,094 | 4/1977 | Dinger et al. | 361/220 |
| 4,559,579 | 12/1985 | Val | 361/220 |
| 4,621,304 | 11/1986 | Oogaki et al. | 361/386 |
| 4,677,520 | 6/1987 | Price | 361/220 |
| 4,928,199 | 5/1990 | Diaz et al. | 361/56 |

Primary Examiner—Steven L. Stephan
Assistant Examiner—Ben Davidson
Attorney, Agent, or Firm—Bernard E. Franz; Donald J. Singer

[57] ABSTRACT

The RICTPD device is designed to protect integrated circuits with external leads on the sides of the case from electrical transients caused by lightning, switching inductive loads such as electrical motors, or other sources. The RICTPD is usually used when a particular IC is identified as most likely to fail in a system. The RICTPD comprises a casing which is slightly larger than the IC casing, and has metal legs in the form of springs which provide a friction fit on the legs of the IC. The inside top of the device case has a plurality of transient protection devices (TPDs) built in between a metal ground plane and the metal legs. A grounding strap is attached from a ground terminal which is part of the ground plane on the device to an available ground on the circuit board. The TPDs may consist of metal oxide varistors, surgectors or zener diodes made to be aligned with the IC legs and the ground plane of the device. The device may be installed over the IC by a press fit. In operation of the device, when a transient overvoltage greater than the clamping voltage of the TPD is seen at one of the IC leads, the TPD is triggered and shunts the current away from the IC. The current flows from the leg of the device through the TPD to the ground plane and then to system ground thereby protecting the IC.

2 Claims, 2 Drawing Sheets

RETROFIT INTEGRATED CIRCUIT TERMINAL PROTECTION DEVICE

RIGHTS OF THE GOVERNMENT

The invention described herein may be manufactured and used by or for the Government of the United States for all governmental purposes without the payment of any royalty.

BACKGROUND OF THE INVENTION

The present invention relates generally to a Retrofit Integrated Circuit Terminal Protection device (RICTPD), and more particularly to a retrofit device which will protect integrated circuits (ICs) with external leads on the sides of the case from electrical transients caused by lightning, switching inductive loads such as electrical motors, or other sources.

Electrical transients destroy integrated circuits. There is currently no convenient packaged solution for retrofitting existing circuits which require transient protection. Two solutions are to solder discrete TPDs on incoming signal or power wires or to install a commercial surge protector on the power liens. These two solutions will not be successful in every case and there is a need for a quick fix for the problem IC that fails in existing systems and requires constant service.

United States patents of interest include U.S. Pat. No. 3,754,170, to Tsuda et al, which teaches an IC having an RF shield to isolate the IC from RF signals. U.S. Pat. No. 3,614,546 to Avins teaches a shield for an IC comprising an elongated rectangular envelope having rows of leads depending therefrom. A semiconductor is mounted within the envelope. U.S. Pat. No. 4,019,094 to Dinger et al teaches a shorting clip for a semiconductor package for shorting the package leads.

SUMMARY OF THE INVENTION

An objective of the invention is to provide a retrofit integrated circuit terminal protection device (RICTPD) which will protect integrated circuits with external leads on the sides of the case from electrical transients caused by lightning, switching inductive loads such as electrical motors, or other sources. The RICTPD is usually used when a particular IC is identified as most likely to fail in a system.

The device according to the invention comprises a casing which is slightly larger than the IC casing. The inside top of the device case has a plurality of transient protection devices (TPDs) built in and a grounding strap is attached from the ground terminal on the device to an available ground on the circuit board. The TPDs may consist of metal oxide varistors, surgectors or zener diodes made to be aligned with the IC legs and the ground plane of the device. The device may be installed over the IC by a press fit. In operation of the device, when a transient overvoltage greater than the clamping voltage of the TPD is seen at one of the IC leads, the TPD is triggered and shunts the current away from the IC. The current flows from the leg of the device through the TPD to ground plane and then to system ground thereby protecting the IC.

DETAILED DESCRIPTION

Figure 1:
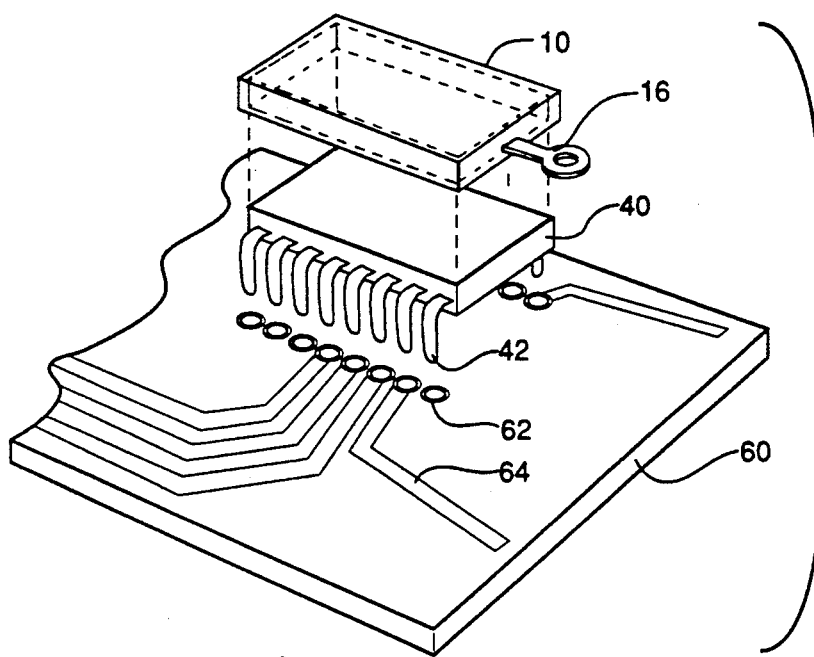
FIG. 1 is an exploded pictorial view of a retrofit integrated circuit terminal protection device (RICTPD), an integrated circuit (IC) device and a printed circuit board.

This invention involves a method for retrofitting transient protection onto an existing integrated circuit. The RICTPD will be manufactured in several versions to fit common ICs such as fourteen and sixteen pin models of ICs with a plastic or ceramic case. Installation will consist of pressing the RICTPD over an existing installed IC until a friction fit is achieved and the RICTPD stays in place and then installing a ground wire from the RICTPD to system ground. The RICTPD could be secured with an additional strap for military or high vibration applications.

The Retrofit Integrated Circuit Protection Device (RICTPD) is used to add electrical transient protection to existing integrated circuits (ICs) which are mounted on printed circuit boards. Retrofitting existing circuit boards with terminal protection is often more expensive than redesigning the electronic system with adequate protection built in. The RICTPD is an alternative to redesign and fits over an existing integrated circuit without disturbing the existing installation on the circuit board.

This particular design uses a friction fit to hold the device in place, however the RICTPD could be soldered in place with only minor changes to the spring loaded legs. These legs connect the leads of the IC to system ground via a terminal protection device (TPD) such as a zener diode, surgector or metal oxide varistor (MOV). The TPDs are built into the case and reside above the IC being protected.

The TPDs are normally open circuits until a specified clamping voltage appears at the IC lead (the electrical transient provides this voltage). When a voltage surge appears at the IC lead, the TPD for that lead begins to conduct and shunts the transient away from the IC to ground. TPDs are not new but a suitable design for retrofit has not been previously proposed. This design could be implemented for any size IC which has legs which exit the IC case on the sides, providing place for the friction fit of the RICTPD. The device shown in the drawings is slightly larger than the IC case.

FIG. 1 is an exploded pictorial view of a retrofit integrated circuit terminal protection device (RICTPD) 10, an integrated circuit (IC) device 40 and a printed circuit board 60. The TPDs are built into the top of the case and a grounding strap (not shown) is attached from a ground terminal 16 on the RICTPD 10 to a convenient ground on the circuit board. The IC 40 may be of the common design having a dual in-line package with 14 or 16 legs 42 on the sides, with half of the legs on each side. These legs 42 serve as terminal leads for mounting through holes 62 of the printed circuit board 60. On the printed circuit board, which may be made of fiber glass for example, there are a number of printed conductors 64 connected to plating around the holes to make contact with the legs of the IC 40.

Figure 2:
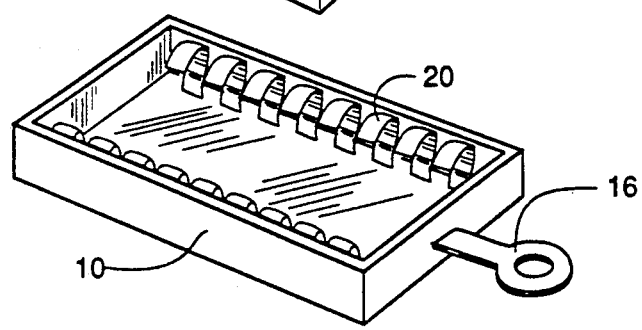
FIG. 2 is a bottom pictorial view of the RICTPD.
Figure 3:
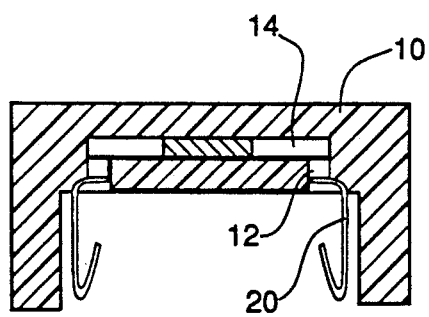
FIG. 3 is an end section view of the RICTPD with the end removed, taken along lines 3—3 of FIG. 5.
Figure 3A:
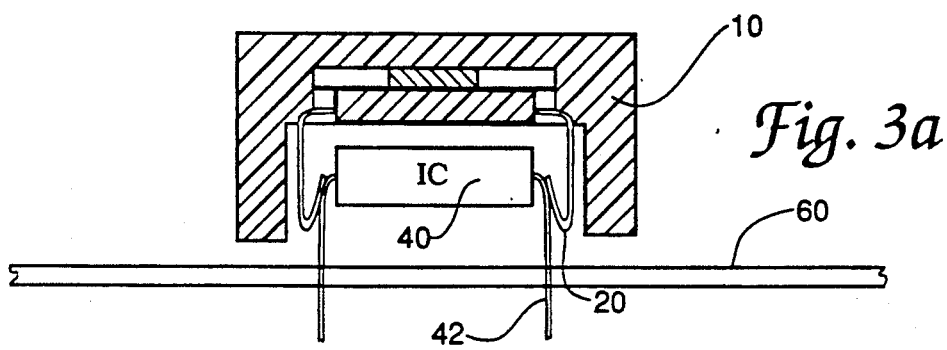
FIG. 3a is the same as FIG. 3 showing the RICTPD mounted on the IC device.
Figure 4:
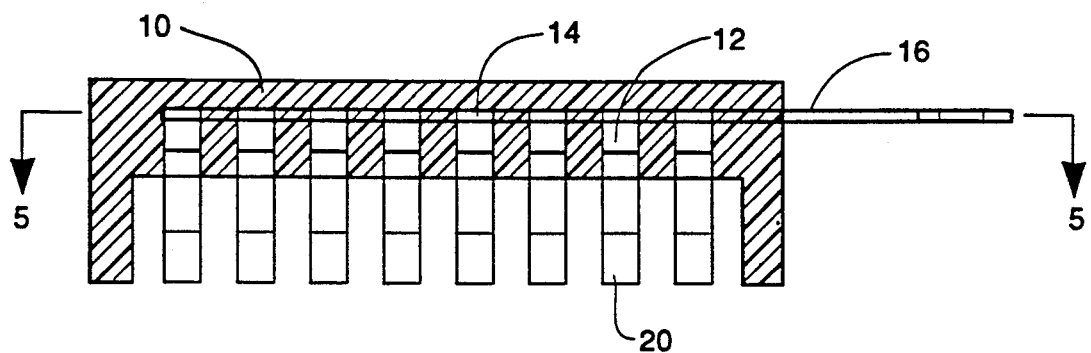
FIG. 4 is a side or longitudinal sectional view of the RICTPD, taken along lines 4—4 or FIG. 5.
Figure 5:
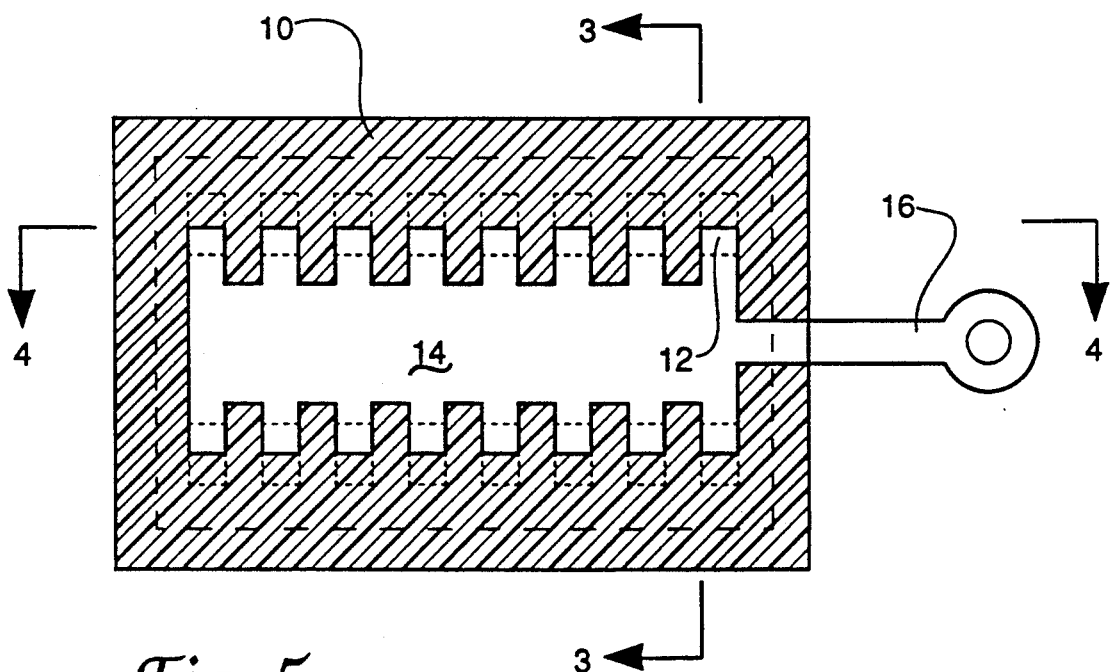
FIG. 5 is a top sectional view of the RICTPD taken along lines 5—5 of FIG. 4

FIG. 2 is a bottom pictorial view of the RICTPD 10, showing metal legs 20. FIG. 3 is an end sectional view of the RICTPD with the end removed, taken along lines 3—3 of FIG. 5, and FIG. 3a is a similar view showing the RICTPD 10 fitted over the IC 20 device 40 on the printed circuit board 60. FIG. 4 is a side or longitudinal sectional view of the RICTPD, taken along lines 4—4 of FIG. 5, and FIG. 5 is a top sectional view of the RICTPD taken along lines 5—5 of FIG. 4. The RICTPD 10 has metal legs 20 which are bent to act as springs for a friction fit over the legs 42 of the integrated circuit. The legs 20 may be about 0.007 inches thick, and their width and spacing corresponds to that of the IC 40.

The RICTPD 10 has a ground plane 14 molded into the case. The case may be of any suitable insulating material, such as bakelite or plastic. The ground plane 14 has fingers extending towards the sides, and the terminal 16 is also an integral part thereof. The legs 20 have a portion molded into the case and bent to extend under the fingers of the ground strap 14. The terminal protection devices 12, which may be MOVs or Zener Diodes, are manufactured to go between the legs 20 and the fingers of the ground plane 14 of the RICTPD. The MOV or diode clamping voltage is selected to fit the application but will typically be 20 to 40 volts.

The RICTPD can be installed on ICs which have repeatedly failed on an existing system to provide relief to service technicians or could be installed on all ICs on the circuit board, the former case being the most likely. This fix could be implemented on all systems with the same failure problem until the IC failure problem is corrected by designing a new circuit board without the failure fault and with adequate transient protection built in at design time. The invention provides a retrofit quick fix solution which is also useful in diagnosing whether or not electrical failures cease, indicating that the cause was probably transients.

The Terminal Protection Devices (TPDs) are either diodes, surgectors of varistors and are manufactured into the plastic case as shown in the drawings. There is one TPD for each leg of the RICTPD and each leg corresponds to an IC lead. Each TPD is connected or manufactured between the legs and the ground plane of the RICTPD. No unusual manufacturing techniques are needed to build the RICTPD. The ground plane must be wired to either circuit board ground or system ground in order to shunt the transient away from the IC. The case is like a box and fits over the case of the IC so that the legs of the RICTPD press against the leads of the IC, making mechanical and electrical contact. If this mechanical contact is insufficient to hold the RICTPD in place, a supplemental strap (not shown) can be used which clips under the ends of the IC (there are no leads on the ends of most ICs).

The device operates as follows: A transient overvoltage which is greater than the clamping voltage of the TPD is seen at one or more of the IC leads. This triggers the TPD so that it begins to conduct current and shunts the transient away from the IC. The current flows through the RICTPD leg, through the TPD to ground plane and then to the system ground, thereby protecting the IC. The TPD continues to protect the IC until the transient dies out or until the TPD is destroyed by the transient. It would not be essential to manufacture protection for all 14 or 16 pins of the IC, however there would be no adverse effect to doing so other than parasitic capacitance and inductance, and no cost savings either way.

The RICTPD case, metal, and TPDs are all common in IC manufacturing or TPD manufacturing and specific dimensions and qualities are not essential to the retrofit nature of this invention. The uniqueness of this invention leis in the packaging of TPDs in such a way as to allow retrofit solutions to design defects which are identified after a system or quantity of systems are in use.

Advantages and new features: There are no available retrofit TPD solutions on the commercial market. There is a need, based on service technicians replacing the same IC repeatedly on numerous electronic systems such as computers or photocopiers which are installed in the field. This invention provides protection in a convenient form which may bypass getting formal approval for a permanent transient protection solution and hence provide the customer with service quickly. In cases where the alternative is to redesign the circuit board, this RICTPD may be the most cost effective solution. The cost would be under $10 each in quantity and would be less once the original Research and Development costs had been recovered.

Alternative modes of the invention may include case variations for ICs which have the leads exiting the case under the device instead of on the sides of the case. Also the TPDs could include transorbs positive temperature coefficient resistors or silicon controlled rectifiers in more unusual cases. The clamping voltages will vary according to the application but will generally be three times greater than the power supply voltage for the IC technology being protected. There is a trend toward 3-volt power supplies replacing 5-volt technology and accompanying this is a lowering of the minimum clamping voltage possible in manufacturing metal oxide varistors. The energy rating of the TPDs is only limited by the space available in the case. It would be possible to use TPDs with larger energy ratings on the legs which protect the power supply leads of the IC, however this would require the technician to stock a larger variety of RICTPDs since the power supply lead assignment is not uniform for all fourteen or sixteen pins of ICs and hence the cost would increase.

It is understood that certain modifications to be invention as described may be made, as might occur to one with skill in the field of the invention, within the scope of the appended claims. Therefore, all embodiments contemplated hereunder which achieve the objects of the present invention have not been shown in complete detail. Other embodiments may be developed without departing from the scope of the appended claims.

What is claimed is:

1. A retrofit integrated circuit terminal protection device (RICTPD) for an integrated circuit having an IC package with external leads on two opposite sides, the device being adapted for mounting on the package to protect the integrated circuit from electrical transients during operation;

wherein said device comprises a casing of insulating material which is slightly larger than the IC package and shaped to fit over the IC package, a plurality of legs of resilient metal, each leg having a first end portion and a second end portion, the first end portion of each leg being bent in a form of a metal spring adapted to provide a friction fit on one of the leads of the IC package, each leg having said second end portion extending into said casing, a metal ground plane in said casing, the metal ground plane being separate from the legs, a plurality of transient protection devices (TPDs) built into said casing, with each transient protection device between the metal ground plane and said first end portion of one of said legs, and a ground terminal extending out of the casing from said metal ground plane for connection to ground.

2. A retrofit integrated circuit terminal protection device according to claim 1, wherein said metal ground plane has fingers extending toward the sides, and wherein said second end portion of each leg is molded into said casing and bent to extend under one of said fingers, each said transient protection device being between the second end portion of one leg and the finger under which the second end portion of that leg extends.

* * * * *